(12) United States Patent
Harrington

(10) Patent No.: US 8,239,881 B2
(45) Date of Patent: Aug. 7, 2012

(54) ZERO-POWER EVENT DETECTOR

(75) Inventor: James B. Harrington, Seminole, FL (US)

(73) Assignee: Honeywell International Inc., Morristown, NJ (US)

( * ) Notice: Subject to any disclaimer, the term of this patent is extended or adjusted under 35 U.S.C. 154(b) by 833 days.

(21) Appl. No.: 12/369,379

(22) Filed: Feb. 11, 2009

(65) Prior Publication Data

US 2010/0205614 A1 Aug. 12, 2010

(51) Int. Cl.
*G06F 13/00* (2006.01)
(52) U.S. Cl. .............................. 719/318; 711/100; 361/6
(58) Field of Classification Search .................. 719/318; 711/100; 361/6
See application file for complete search history.

(56) References Cited

U.S. PATENT DOCUMENTS

| | | | |
|---|---|---|---|
| 3,971,916 A | 7/1976 | Moreno | |
| 4,656,318 A | 4/1987 | Noyes | |
| 4,912,459 A | 3/1990 | McCallie | |
| 5,323,066 A | 6/1994 | Feddeler et al. | |
| 5,789,964 A * | 8/1998 | Voldman | 327/380 |
| 5,821,007 A * | 10/1998 | Harshe et al. | 429/9 |
| 6,469,499 B2 | 10/2002 | Delaporte | |
| 6,617,963 B1 | 9/2003 | Watters et al. | |
| 6,931,075 B2 | 8/2005 | Schlanger et al. | |
| 2005/0261037 A1 | 11/2005 | Raghunath et al. | |
| 2006/0082780 A1 | 4/2006 | Molaskey et al. | |
| 2006/0220803 A1 | 10/2006 | Kranz et al. | |
| 2007/0141983 A1 | 6/2007 | Shyu et al. | |

\* cited by examiner

*Primary Examiner* — Andy Ho
(74) *Attorney, Agent, or Firm* — Shumaker & Sieffert, P.A.

(57) ABSTRACT

Disclosed herein are systems and methods for detecting an event while a powered system is powered off. An exemplary system comprises an event input that is configured to detect an electrical signal created by an event while the system is powered off; a zero-power event memory configured to receive the electrical signal from the event input and use the electrical signal to store an indication that the event occurred, wherein the zero-power event memory is configured to store the indication that the event occurred at least until the system next powers on; a read subsystem that is configured to, when the system powers on, access the zero-power event memory and determine whether or not an event occurred while the system was powered off; and a reset subsystem that is configured to, when the system powers off, cause the zero-power event memory to reset to a state indicating that no event has occurred. Further, the system may comprise an event response subsystem configured to take appropriate responsive actions when an event is detected.

20 Claims, 4 Drawing Sheets

ZERO-POWER EVENT DETECTOR

BACKGROUND

Many military and commercial devices and systems are operated on battery power. When the equipment is in the "off" mode, most of, if not all of, the circuitry is powered down. There are times when the operator wants the equipment to register an event has occurred, so that when the equipment is turned on (powered up), the detected event is apparent. Often additional circuitry has to be added to the equipment to monitor a pulse on a signal line (e.g., from a momentary switch or from another piece of test equipment). Further, in battery powered devices, the extra circuitry may consume power from the battery, resulting in shorter battery life.

OVERVIEW

The exemplary methods and systems described in this disclosure provides a means of detecting that an event has occurred, and storing an indication of the event's occurrence for later retrieval, without using additional power from the battery system. In particular, a pulse or switch contact may cause a zero-power event detector to change state and remain in that state so that the occurrence of the event is recognized by an associated powered system upon power-up.

In one aspect, a zero-power event detection system that is configured to provide event detection for a powered system, while the powered system is powered off is disclosed. The zero-power event detection system may include: (a) an input configured to receive an electrical signal created by an event that occurs while the powered system is powered off; (b) a zero-power event memory configured to (i) operate in a first state that indicates that no event has occurred and a second state that indicates an event has occurred and (ii) use the electrical signal created by the event to operate in the second state indicating that an event has occurred; (c) a read subsystem that is configured to, when the powered system powers on, access the zero-power event memory and determine whether or not an event has occurred; and (d) a reset subsystem that is configured to, when the powered system powers off, cause the zero-power event memory to enter and operate in the first state indicating that no event has occurred.

Further, the zero-power event detection system may include an event response system. As such, the read subsystem may be configured to provide a signal indicating whether or not an event has occurred to the event response system. The event response system may then take an appropriate action, such as an emergency response action, if an event occurred while the powered system was powered off.

The zero-power event memory may include a capacitor, which may be discharged to indicate that no-event has occurred (i.e., the zero-power event detector operates in the first state after being discharged). The input may operate to apply a voltage of the electrical signal created by the event to the capacitor. The voltage from the electrical signal may then charge the capacitor, indicating that an event has occurred (i.e., the zero-power event detector operates in the second state after being charged).

In another aspect, a method for zero-power detection of an event that occurs while a powered device is powered off is disclosed. The method may be carried out, at least in part, by a zero-power event detection system that is incorporated in or communicatively coupled to the powered device. The method comprises: (a) providing an input configured to receive one or more electrical signals that are generated by the occurrence of one or more events, wherein each electrical signal defines a voltage, wherein the input is operable to receive the one or more electrical signals while the powered device is powered off; (b) applying the first voltage to a zero-power event memory, wherein the zero-power event memory comprises a capacitor, wherein the capacitor is discharged prior to the occurrence of the event, and wherein the application of the first voltage to the zero-power event memory charges the capacitor; (c) the capacitor storing the charge from the application of the first voltage until the powered device powers on; and (d) in response to the powered system powering on, querying the zero-power event memory as to whether or not an event occurred while the powered device was powered off and providing an indication as to whether or not an event occurred to the powered system. The method may further involve, in response to the powered system powering off, resetting the zero-power event memory to indicate that no event has occurred.

In another aspect, a system configured to detect an event while the system is powered off is disclosed. The system comprises an event input that is configured to detect an electrical signal created by an event while the system is powered off, a zero-power event memory configured to receive the electrical signal from the event input and use the electrical signal to store an indication that the event occurred, wherein the zero-power event memory is configured to store the indication that the event occurred at least until the system next powers on; a read subsystem that is configured to, when the system powers on, access the zero-power event memory and determine whether or not an event occurred while the system was powered off; and a reset subsystem that is configured to, when the system powers off, cause the zero-power event memory to reset to a state indicating that no event has occurred. Further, the system may comprise an event response subsystem configured to take appropriate responsive actions when an event is detected.

These as well as other aspects, advantages, and alternatives, will become apparent to those of ordinary skill in the art by reading the following detailed description, with reference where appropriate to the accompanying drawings.

BRIEF DESCRIPTION OF THE DRAWINGS

An exemplary embodiment of the present invention is described herein with reference to the drawings, in which.

DETAILED DESCRIPTION

Exemplary methods and systems provide zero-power event detection for a powered system (also referred to as a "powered device"). The powered system may be, for example, a computer such as a laptop, desktop, or server, or may be cell phone or personal digital assistant (PDA). More generally, the powered system may be any system capable of being powered on and off.

While powered off, most devices cannot electronically interface with other systems, much less store new information. As such, the zero-power event detector functions to detect an occurrence of the event while the powered system is powered off. The zero-power event detector stores an indication that the event occurred, so that the powered system can be notified when, at a later time, the powered system powers on. An exemplary zero-power event detector may be incorporated into a powered device, or alternatively, may be separately housed and communicatively coupled to the powered device. The powered device can then query the zero-power event detector to learn if an event has occurred while it was powered off.

Figure 1:
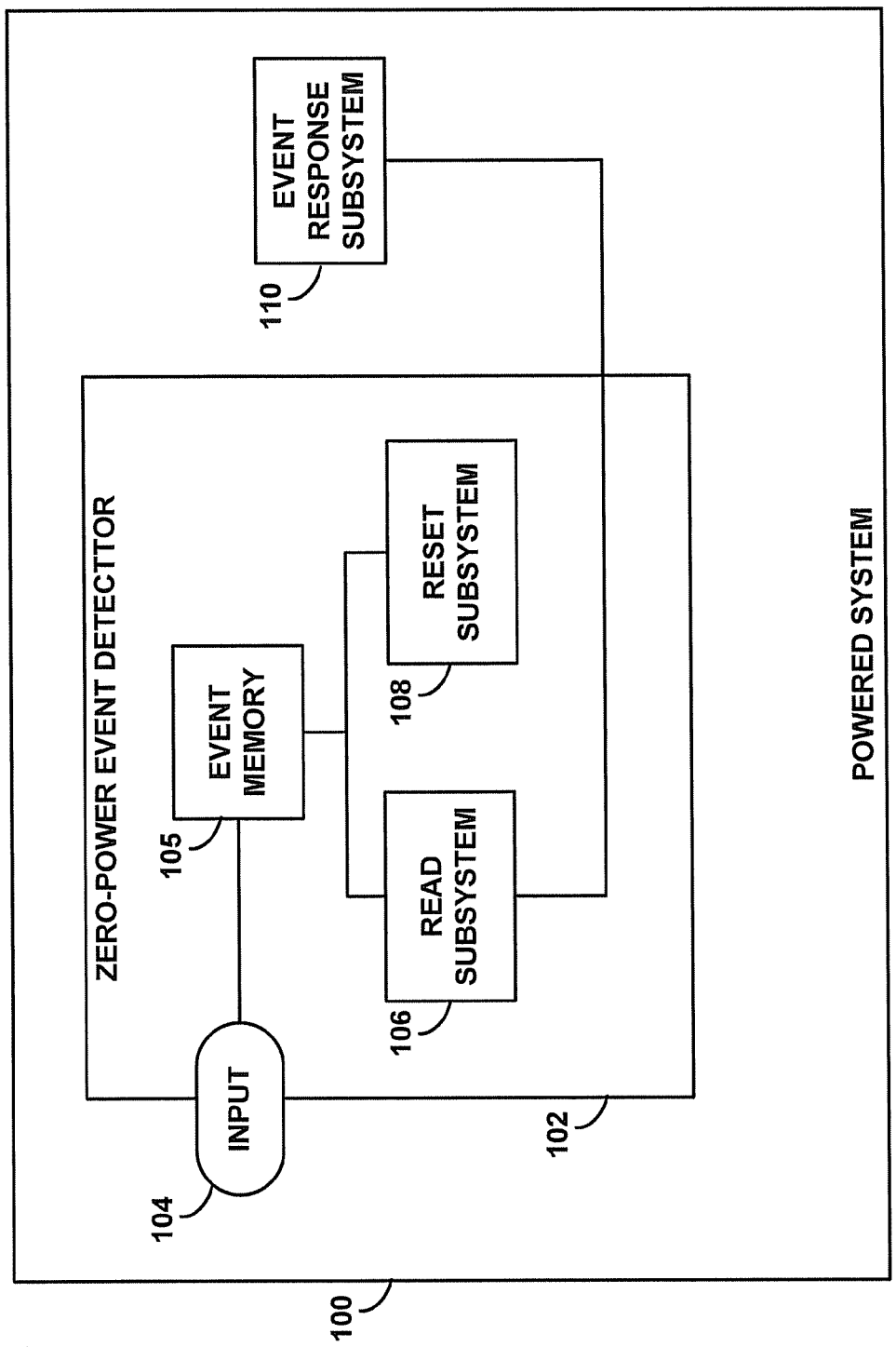
FIG. 1 is a simplified block diagram illustrating an exemplary system that incorporates a zero-power event detector.

FIG. 1 is a simplified block diagram illustrating a powered system 100 that incorporates a zero-power event detector 102, according to an exemplary embodiment. The zero-power event detector 102 includes an event detection input 104, event memory 105, a read subsystem 106, and a reset subsystem 108. In addition to zero-power event detector 102, the powered system 100 may include an event response subsystem 110 that is communicatively coupled to zero-power event detector 102.

It should be understood that zero-power event detector 102 or certain components thereof may be implemented by circuitry, hardware, firmware, and/or software that is fully integrated with other existing circuitry, hardware, firmware, and/or software of powered system 100 that serve various functions other than event detection. Yet further, zero-power event detector 102 or certain components thereof may be housed separately, so that zero-power event detector 102 may function as an "add-on" to existing systems. Thus, zero-power event detector 102 may be backwards compatible to provide zero-power event detection for existing systems. In addition, zero-power event detector 102 may be portable between different types of systems.

The event detection input 104 may function to detect an event that occurs while powered system 100 is powered off. Further, event detection input 104 may be communicatively coupled to zero-power event memory 105, which is configured to store an indication that an event occurred while the powered system 100 is powered off (i.e., zero-power event memory 105 does not require a power source to store an indication of an event). As such, when event detection input 104 detects an event, zero-power event memory 105 can store an indication that the event occurred, which may be accessed upon powering on.

In an exemplary embodiment, event memory 105 includes a capacitor that charges to a positive voltage when a pulse from an external source is applied to the event detection input 104. Thus, in an exemplary embodiment, zero-power event detector 102 may be viewed as operating in two states: (1) an "event" state, which indicates that an event has occurred while the powered device was powered off (e.g., when the capacitor is charged) and (2) a "no-event" state, which indicates that no event has occurred while the powered device was powered off (e.g., when the capacitor is not charged). In an alternative embodiment, the states may be reversed, so that the capacitor is charged in the "no-event" state, and is discharged in the "event" state.

Advantageously, the capacitor in zero-power event detector 102 may use power supplied by the event itself to store an indication that the event occurred (i.e., to charge the capacitor and operate in the "event" state). As a result, when the powered system is powered off, and no power is supplied to the zero-power event detector, the zero-power event detector can still detect and store an indication of an event for the powered system. In addition, the zero-power event detector may incorporate capacitors that are capable of maintaining a charge for a great deal of time, possibly even years. Thus, the possibility exists that a device that has been powered off for several years can learn from its associated zero-power event detector that an event occurred while it was powered off, even if the event occurred years before.

To help prevent an erroneous indication of an event, zero-power event detector 102 may include a reset subsystem 108 that is configured to cause the zero-power event detector to reset to the "no-event" state, before the powered device 100 powers off. In practice, the powered device 100 may use reset subsystem 108 to reset event memory 105 as part of a power-off routine, which is performed whenever the device 100 is powered off.

To determine if an event has occurred while powered off, the powered device 100 may include a read subsystem 106, which functions to query event memory 105 as to whether or not an event occurred while the powered device 100 was powered off. Zero-power event detector 102 may be configured to use read subsystem 106 to query event memory 105, as part of power-on routine.

Figure 2:
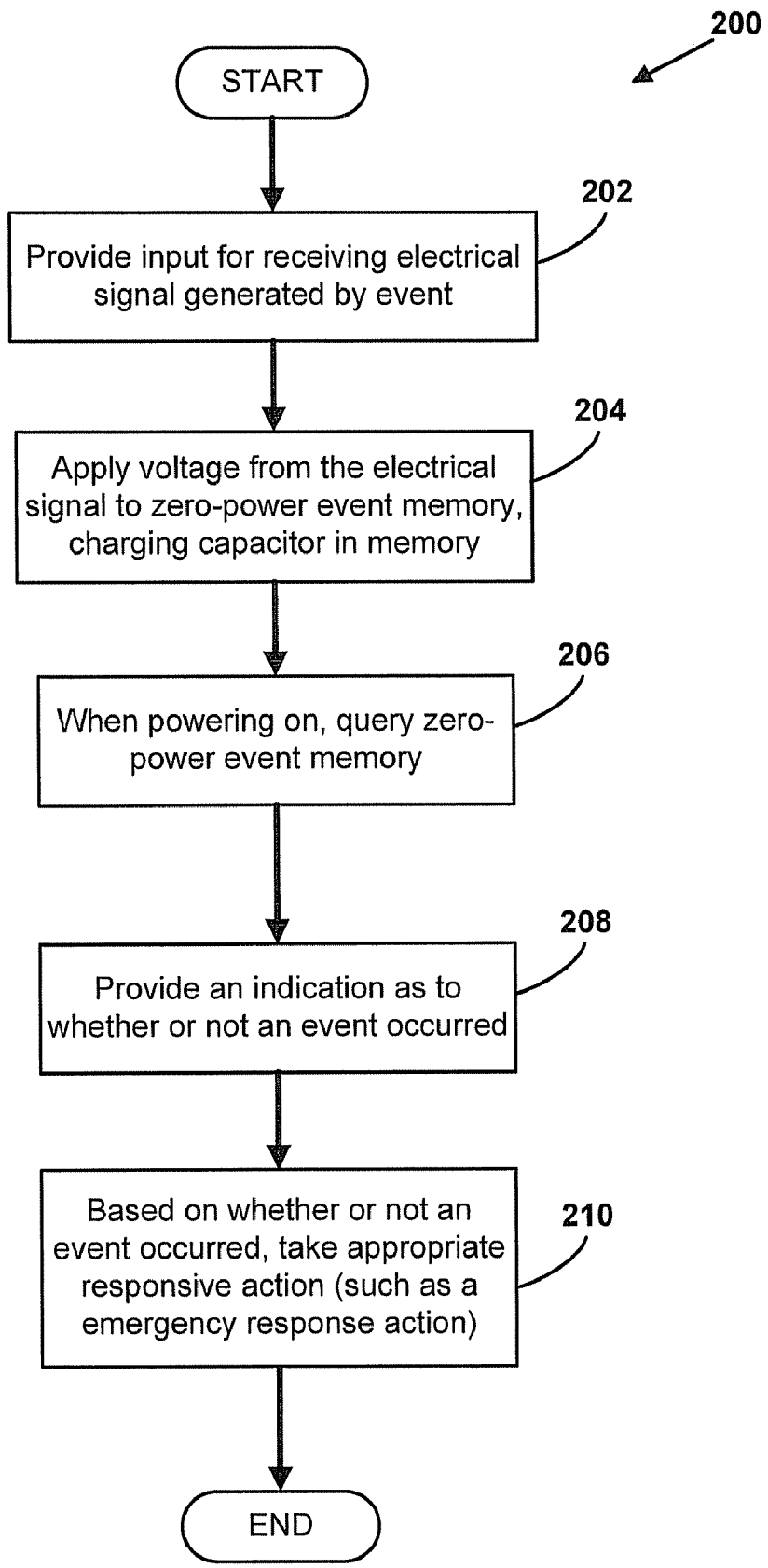
FIG. 2 is flow chart illustrating an exemplary method for zero-power detection of an event that occurs while a powered device is powered off.

FIG. 2 is flow chart illustrating an exemplary method 200 for zero-power detection of an event that occurs while a powered device is powered off. The method may be carried out, at least in part, by a zero-power event detection system that is incorporated in or communicatively coupled to a powered device.

The method may involve providing an input that is configured to receive an electrical signal that is generated by the occurrence of an event, as shown by block 202. The electrical signal, which may have an associated voltage, may be received at the input while the device is powered off (with no power supplied to the input for purposes of detection, other than that of the detected signal itself). The associated voltage from the event-generated signal may then be applied to a zero-power event memory that includes a capacitor, thus charging the capacitor, as shown by block 204. In order to help improve the accuracy of event detection, the capacitor may be discharged prior to the occurrence of the event, so that an indication that the event occurred may be stored in the event memory by charging the capacitor. Further, to store the indication of the event, the capacitor holds the charge, at least until the powered device powers on.

The method further involves, when the device is powering on, querying the zero-power event memory to determine whether or not an event occurred while the device was powered off, as shown by block 206. In practice, a read subsystem may function to query the zero-power event memory. Based on the results of the query, the read subsystem may provide an indication as to whether or not an event occurred so that the device may take appropriate responsive action, as shown by block 208. In an exemplary embodiment, the read subsystem may provide this indication to an event response subsystem, which in turn may take an emergency response action, as shown by block 210.

Figure 3:
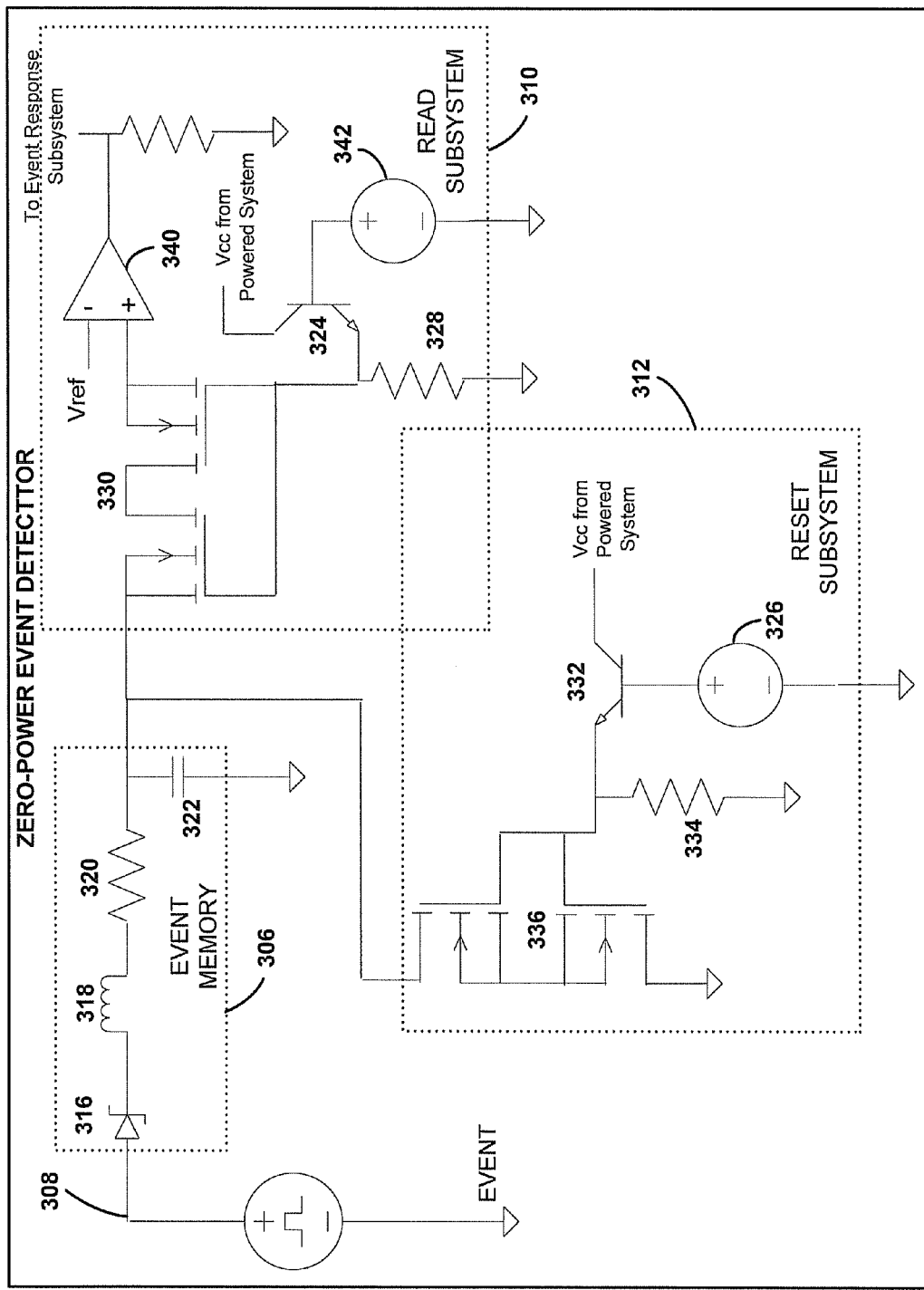
FIG. 3 is a simplified circuit diagram illustrating a zero-power event detector that provides zero-power event detection for a powered system.

FIG. 3 is a simplified circuit diagram illustrating a zero-power event detector 302 that provides zero-power event detection for a powered system. Zero-power event detector 302 includes an event memory 306, event input 308, read subsystem 310, and reset subsystem 312. Generally, the read subsystem 310 functions to query event memory 306 and determine if an event has occurred, while reset subsystem 312 functions to reset event memory 306. The zero-power event detector 302 may also include an event response subsystem (not shown) for taking appropriate action when an event occurs while the powered system is powered off. In practice, however, an event response subsystem may be more appropriately included as part of the powered system (not shown), which reacts to the output of the zero-power event detector.

Further, read subsystem 310 and/or reset subsystem 312 may also be included as part of the powered system, and may include or have access to an interface between the powered system and the zero-power event detector.

Zero-power event detector 302 may be configured such that when an event occurs and generates a pulse, the voltage of the pulse is applied to event input 308. The power created by the pulse can then be harnessed by zero-power event detector 302 to detect that the event occurred without itself providing power. In an exemplary embodiment, zero-power event detector 302 may include circuitry such as diode 316, inductor 318, and resistor 320 (collectively the "event conditioner") which are configured in series. As such, this circuitry or equivalents thereof, may detect the event by transferring the pulse from event input 308 to event memory 306, while substantially suppressing spurious signals.

In an exemplary embodiment, event memory 306 includes a capacitor 322 that stores an indication of whether or not an event has been detected by zero-power event detector 302. Capacitor 322 is configured such that when powered system is powered off, the capacitor is in series with the detection circuitry. Therefore, when the powered system is powered off and an event is detected at event input 308, the detection circuitry may apply the voltage generated by the event (i.e., the voltage associated with the pulse) to capacitor 322. The applied voltage from the pulse charges capacitor 322, indicating that the event occurred.

Zero-power event detector 302 is configured such that once charged, capacitor 322 remains substantially charged until a reset signal is received from reset circuitry 312. However, it is contemplated that the charge may decrease over time. Thus, while other embodiments are within the scope of the invention, a preferred embodiment incorporates a capacitor and/or other circuitry that prevents substantial leakage and is as resistant to aging as possible. Such a capacitor may store an indication of an event for a long period of time. For example, with current capacitors, the indication may be stored for a number of years, and it is contemplated that improved capacitors may increase storage time, without departing from the scope of the invention.

As noted, reset subsystem 312 is configured to reset event memory 306, so that event memory 306 indicates that no event has occurred. Reset subsystem 312 includes a transistor 332 that is connected to power source 326 (e.g., control logic in the powered system), a resistor 334 that is connected to ground, and a switch 336, which may take the form of a high-impedance MOSFET. The switch 336 is configured such that when no voltage is applied across transistor 332, switch 336 is disconnected, thus breaking the circuit between capacitor 322 and ground. When the associated powered system is powered on, power source 326 is also powered on and thus applies a voltage to transistor 332, switch 336 is connected, and thus allows current to flow through switch 336 from capacitor 322 to ground. Therefore, applying a voltage to transistor 332 has the effect of grounding capacitor 322, allowing it to discharge and return to the "no event" state.

To help improve the accuracy with which zero-power event detector 302 detects events, reset subsystem 312 may be configured to reset event memory 306 whenever the associated powered system is powering off or is about to power off. Accordingly, a powered system may implement a power-off procedure that includes resetting event memory 306. In particular, during a power-off procedure, a voltage may be applied to transistor 332, which discharges capacitor 322, returning event memory 306 to the "no-event" state.

Referring now to read subsystem 310, it is configured to read an indication of whether or not an event has occurred from event memory 306. In particular, when powering on, the associated powered system may be configured to query zero-power event detector 302 as to whether or not an event occurred while the system was powered off. Accordingly read subsystem 310 may include a transistor 324 that is connected to a power source 342 (which preferably takes the form of control logic in the associated powered system), a resistor 328 that is connected to ground, and a switch 330, which may take the form of a high-impedance MOSFET. The switch 330 is configured such that when no voltage is applied to transistor 324, switch 330 is disconnected, thus breaking the circuit between capacitor 322 and the event response subsystem. When the associated powered system is turned on, control logic from the powered system applies a voltage (shown as power source 342) to transistor 324, which connects switch 330, and thus allows current to flow through switch 330 from capacitor 322 to comparator 340.

In order that read subsystem 310 query event memory 306 upon power-on, transistor 324 may be connected to a main power supply of the associated powered system. With this configuration, switch 330 may be disconnected whenever the powered system is powered off, and may be connected and thus query event memory 306, whenever the powered system is powered on. In an alternative embodiment, a processor or other means may implement a power-on procedure, which may cause read subsystem 310 to query event memory 306.

Comparator 340 may be configured to ascertain the state of zero-power event detector 302. As illustrated, an exemplary comparator 340 may take the form of an operational amplifier ("op amp"). The comparator compares the voltage applied from switch 330 to a reference voltage $V_{ref}$. Thus, when switch 330 is connected, the voltage stored on capacitor 322 is effectively supplied to the comparator 340 for comparison to $V_{ref}$. As such, $V_{ref}$ is preferably set below the voltage that is expected to be stored on capacitor 322 when an event occurs. Thus, an applied voltage that is greater than or equal to $V_{ref}$ indicates that the zero-power event detector is in the "event" state. Preferably, the voltage $V_{ref}$ is such that the voltage from the powered system ($V_{cc}$) is greater than $V_{ref}$ plus two times the direct current voltage applied at power source 342 (i.e., $V_{cc} > V_{ref} + 2 * V_{dc}$).

The comparator 340 is configured to output an event status signal to the powered device, which indicates whether or not an event occurred while the powered device was powered off. More specifically, if the applied voltage from switch 330 is greater than or equal to $V_{ref}$, the comparator 340 outputs an event-status signal indicating that an event occurred. If, on the other hand, no event has occurred and capacitor 322 holds no charge, the applied voltage is expected to be less than $V_{ref}$. In this case, when the applied voltage from switch 330 is less than $V_{ref}$, comparator 340 outputs a status signal indicating that no event occurred.

The powered device may be configured to take action in response to an event that occurs while it is powered off. In an exemplary embodiment, the responsive action may be an emergency response action. For example, the powered device may include memory storing various kinds of data, and may respond to the event by permanently deleting all of its stored data. Additionally or alternatively, the powered device may lock itself so that the device is inaccessible for any purpose. As a more drastic example, the powered device, or parts of the powered device such as its memory, may physically self-destruct (by triggering an explosive device or causing an electrical short circuit, for instance). Other emergency response actions, as well as non-emergency response actions are possible.

It should also be understood that, while the primary function of the zero-power event detection system is detecting events for the powered device, while the powered device is powered off, the zero-power event detector may also detect an event while the powered device is powered on. As such, read subsystem 310 may be configured to automatically query event memory 306 according to predefined schedule or in response to certain events 308, while the powered device is powered on. Alternatively, the zero-power event detector may be effectively disconnected (e.g. by applying a voltage to transistor 332 and thus grounding capacitor 322) while the powered device is powered on.

It should be understood that zero-power event detector 302 and powered device 304 may include hardware (e.g., processor(s), memory, etc.), firmware, and/or software as is necessary to provide the functionality described herein. For instance, a processor and firmware and/or software may be provided control reset subsystem 312 and cause it to operate during shutdown, to control read subsystem 310 and cause it to operate during power on, etc.

Figure 4:
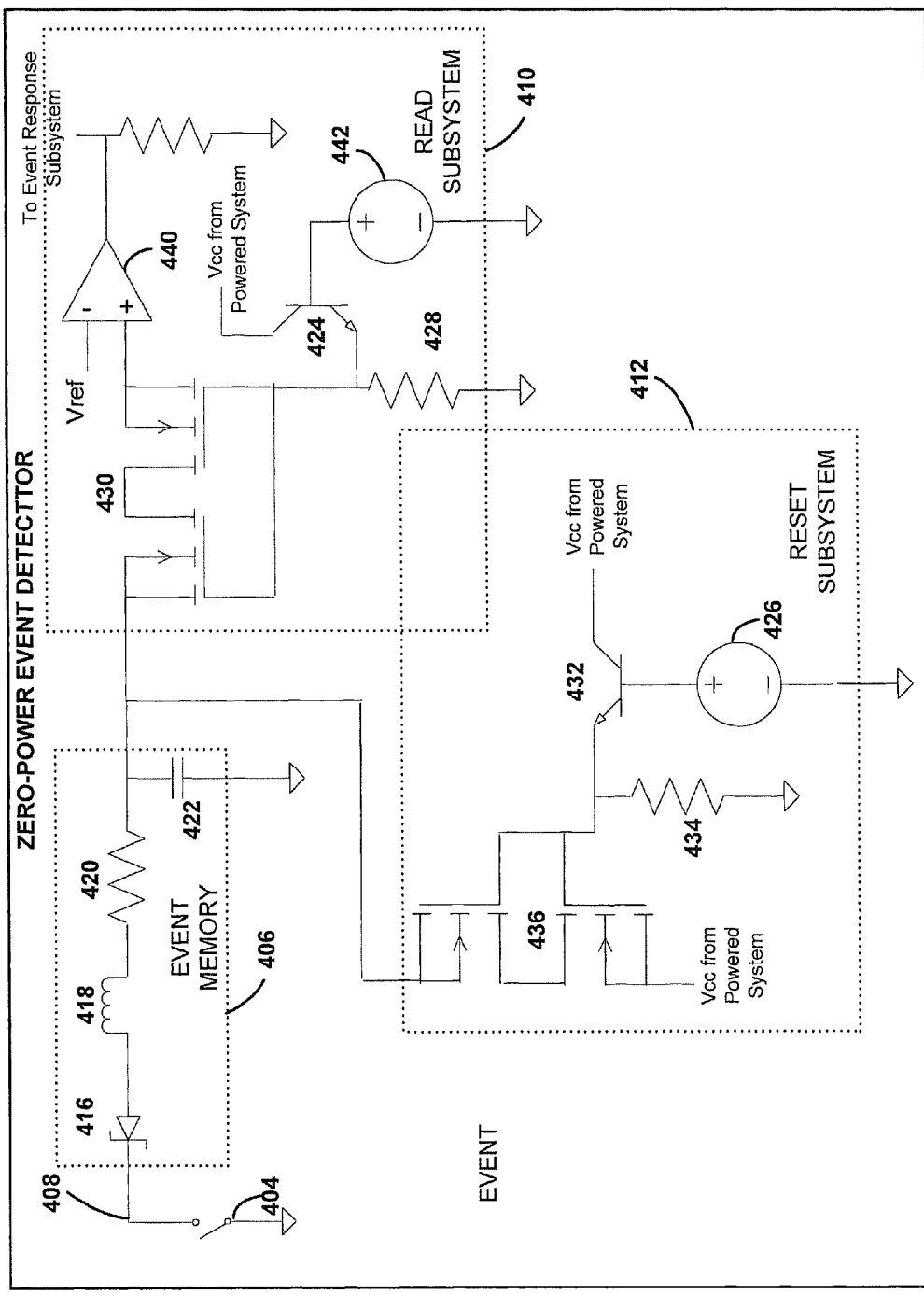
FIG. 4 is another simplified circuit diagram illustrating a zero-power event detector that provides zero-power event detection for a powered system.

FIG. 4 is a simplified circuit diagram illustrating a zero-power event detector 402 that provides zero-power event detection for a powered system. Zero-power event detector 402 includes event memory 406, read subsystem 410, and reset subsystem 412. Event memory 406 serves to detect an event at event input 408. Generally, the read subsystem 410 functions to query event memory 406 and determine if an event has occurred (e.g., if the charge on capacitor 422 is below the threshold charge), while reset subsystem 412 functions to reset event memory 406 (e.g., by charging capacitor 422 to an initial charge level). Read subsystem 410 and/or reset subsystem 412 may also be included as part of the powered system, and may include or have access to an interface between the powered system and the zero-power event detector.

Event memory 406 includes diode 416, inductor 418, resistor 420, and capacitor 422. Zero-power event detector 402 is similar to detector 302 of FIG. 3, except that it is configured for ground pulse activation; that is, the capacitor 422 in event memory 406 is charged in the "no-event" state, and is discharged when an event occurs, such that there is less, or possibly no charge on capacitor 422. Accordingly, the direction of diode 416 is reversed, as compared to diode 316.

Zero-power event detector 402 also includes a switch 404 that is connected to ground may initiate an event. In particular, when the switch 408 is closed, capacitor 422 begins discharging. When the charge on capacitor 422 drops below a certain threshold, this may be considered an indication that an event has occurred. The threshold charge that indicates an event has occurred may be selected as a matter of engineering design choice. Furthermore, the length of time for which switch 408 must be closed (and for which capacitor 422 discharges) to reach the threshold charge, may also be selected as a matter of engineering design choice. In particular, the rate of discharge and/or the amount of discharge required may be varied by changing the values of resistor 420, capacitor 422, and/or the initial charge stored on capacitor 422.

As noted, reset subsystem 412 functions to reset charge zero-power event detector 402 to a "no event" state by charging capacitor 422. In particular, when a voltage is applied via power source 426, switch 436 turns on, which in turn charges capacitor 422. Power source 426 may be controlled by control logic in zero-power event detector 402 or its associated powered system (in the event they are distinct entities). Further, it should be understood that while reset subsystem 412 may fully recharge capacitor 422, it is also possible that it simply recharges it beyond the reference voltage $V_{ref}$.

Also as noted, read subsystem 410 functions to, upon the associated powered system powering on, determine whether or not an event occurred while the powered system was powered off. In particular, when the powered system turns on, a voltage is applied from power source 442 to switch 430, which in turn applies the voltage of capacitor 422 to comparator 440. Comparator 440 then compares the voltage of capacitor 422 to the reference voltage $V_{ref}$. If $V_{ref}$ is less than the reference voltage, then it is determined that an event occurred. Otherwise, if $V_{ref}$ is greater than or equal to the reference voltage, then it is determined that no event occurred.

Note that either zero-power event detector 402 of FIG. 4 or zero-power event detector 302 of FIG. 3 may be preferable, depending upon the scenario. For example, zero-power event detector 302 may be preferable for sensing remote events (e.g., input 308 may be connected over long distances to a power source generating a pulse that constitutes an event). Zero-power event detector 402, however, may be preferable for sensing local events (e.g., such as the press of a button which may be part of the zero-power event detector and/or its associated powered system). There are also failsafe differences between the embodiments illustrated in FIGS. 3 and 4. In particular, the interpretation when the circuit of FIG. 3 fails may be that no event has occurred, while the interpretation when the circuit of FIG. 4 fails may be that an even has occurred.

Exemplary embodiments of the present invention have been described above. It should be understood the word "exemplary" is used herein to mean "serving as an example, instance, or illustration." Any embodiment described herein as "exemplary" is not necessarily to be construed as preferred or advantageous over other embodiments. In addition, those skilled in the art will understand that changes and modifications may be made to these exemplary embodiments without departing from the true scope and spirit of the invention, which is defined by the claims.

I claim:

1. A system configured to detect an event while the system is powered off, the system comprising:
 an input that is configured to receive an electrical signal created by an event, even while the system is powered off,
 a zero-power event memory configured to:
  operate in a first state that indicates no event has occurred;
  operate in a second state that indicates an event occurred; and
  use the electrical signal created by the event to switch from the first state to the second state, thereby storing an indication that the event occurred; and
 a read subsystem that is configured to, when the system powers on, access the zero-power event memory and determine whether or not an event occurred while the system was powered off.

2. The system of claim 1, further comprising a reset subsystem that is configured to cause the zero-power event memory to switch to and operate in the first state that indicates that no event has occurred.

3. The system of claim 1, wherein the electrical signal comprises a pulse having an associated voltage.

4. The system of claim 3, wherein the zero-power event memory comprises a capacitor, and wherein using the electrical signal created by the event to operate in the second state comprises applying the voltage of the pulse to the capacitor, thereby charging the capacitor.

5. The system of claim 1, wherein the electrical signal comprises a ground pulse.

6. The system of claim 5, wherein the zero-power event memory comprises a capacitor, wherein the capacitor is charged before the event occurs, and wherein the system is configured to use the electrical signal created by the event to switch to and operate in the second state by applying the ground pulse to the capacitor, thereby discharging the capacitor.

7. The system of claim 1, further comprising an event response system, wherein the read subsystem is configured to provide an indication of whether or not an event has occurred to the event response system.

8. A method for zero-power detection of an event that occurs while a powered device is powered off, wherein the method is carried out, at least in part, by a zero-power event detection system communicatively coupled to the powered device, the method comprising:
providing an input configured to receive at least one electrical signal that is generated by the occurrence of one or more events, wherein each electrical signal defines a voltage, and wherein the input is operable to receive the electrical signal while the powered device is powered off;
applying the voltage of the electrical signal to a zero-power event memory, wherein the zero-power event memory comprises a capacitor, wherein the capacitor is discharged prior to the occurrence of the event, and wherein the application of the voltage to the zero-power event memory charges the capacitor;
the capacitor storing the charge from the application of the voltage until the powered device powers on; and
in response to the powered system powering on, querying the zero-power event memory as to whether or not an event occurred while the powered device was powered off and providing an indication as to whether or not an event occurred to the powered device.

9. The method of claim 8, further comprising, in response to the powered system powering off, resetting the zero-power event memory to indicate that no event has occurred.

10. The method of claim 9, wherein resetting the zero-power event memory to indicate that no event has occurred comprises discharging the capacitor to ground.

11. The method of claim 8, further comprising:
if the indication provided to the powered system indicates that an event did not occur while the powered system was powered off, the powered system powering on as it otherwise would; and
if the indication provided to the powered system indicates that an event did occur while the powered system was powered off, the powered system taking an emergency response action.

12. The method of claim 11, wherein the powered system comprises memory storing data, and wherein the powered system taking an emergency response action comprises the powered system erasing the data.

13. The method of claim 11, wherein the emergency response action comprises locking the powered device so that access to the powered device is denied.

14. The method of claim 11, wherein the emergency response action comprises physical destruction of the powered device or physical destruction of one or more parts of the powered device.

15. A system configured to detect an event while the system is powered off, the system comprising:
an event input that is configured to detect an electrical signal created by an event while the system is powered off;
a zero-power event memory configured to receive the electrical signal from the event input and use the electrical signal to store an indication that the event occurred, wherein the zero-power event memory is configured to store the indication that the event occurred at least until the system next powers on;
a read subsystem that is configured to, when the system powers on, access the zero-power event memory and determine whether or not an event occurred while the system was powered off; and
a reset subsystem that is configured to, when the system powers off, cause the zero-power event memory to reset to a state indicating that no event has occurred.

16. The system of claim 15, wherein the zero-power event memory comprises a capacitor.

17. The system of claim 16, wherein the capacitor is initially discharged before an event occurs, and wherein using the electrical signal to store the indication that the event occurred comprises charging the capacitor.

18. The system of claim 16, wherein the capacitor is initially charged before an event occurs, and wherein using the electrical signal to store the indication that the event occurred comprises discharging the capacitor.

19. The system of claim 15, further comprising an event response subsystem, wherein the event response subsystem is configured to:
receive an indication as to whether or not an event occurred while the system was powered off from the read subsystem;
if the indication is that an event did occur while the system was powered off, take one or more actions responsive to the event; and
if the indication is that an event did not occur while the system was powered off, allow the system to function as it otherwise would.

20. The system of claim 19, wherein the one or more actions responsive to the event comprise one or more emergency response actions.

* * * * *